United States Patent
Shiue et al.

[11] Patent Number: 5,923,088
[45] Date of Patent: Jul. 13, 1999

[54] BOND PAD STRUCTURE FOR THE VIA PLUG PROCESS

[75] Inventors: Ruey-Yun Shiue; Wen-Teng Wu; Pi-Chen Shieh; Chin-Kai Liu, all of Hsin-Chu, Taiwan

[73] Assignee: Taiwan Semiconductor Manufacturing Company, Ltd., Hsin-Chu, Taiwan

[21] Appl. No.: 08/929,953

[22] Filed: Sep. 15, 1997

Related U.S. Application Data

[62] Division of application No. 08/703,918, Aug. 22, 1996, Pat. No. 5,700,735.

[51] Int. Cl.$^6$ .................................................. H01L 23/522
[52] U.S. Cl. .......................... 257/758; 257/774; 257/781; 257/786
[58] Field of Search .................................. 257/761, 781, 257/786, 780, 758

[56] References Cited

U.S. PATENT DOCUMENTS

| | | | |
|---|---|---|---|
| 5,034,346 | 7/1991 | Alter et al. | 257/761 |
| 5,149,674 | 9/1992 | Freeman, Jr. et al. | 257/781 |
| 5,248,903 | 9/1993 | Heim | 257/781 |
| 5,266,522 | 11/1993 | DiGiacomo et al. | 437/192 |
| 5,345,108 | 9/1994 | Kikkawa | 257/761 |
| 5,403,777 | 4/1995 | Bryant et al. | 437/183 |
| 5,502,337 | 3/1996 | Nozaki | 257/774 |
| 5,646,449 | 7/1997 | Nakamura et al. | 257/761 |
| 5,736,791 | 4/1998 | Fujiki et al. | 257/781 |
| 5,739,587 | 4/1998 | Sato | 257/758 |

*Primary Examiner*—David B. Hardy
*Attorney, Agent, or Firm*—George O. Saile; Stephen B. Ackerman; Larry J. Prescott

[57] ABSTRACT

A bond pad structure and method of forming the bond pad structure which provides for reliable interconnections between the bond pad structure and the next level of circuit integration. The bond pad structure uses three metal pads separated by layers of dielectric. Via plugs are formed between the first and second metal pads and between the second and third metal pads. The via plugs are formed in a diamond shape with respect to the metal pads. The metal pads are squares with the same orientation. The periphery of the via plugs forms a square rotated 45° with respect to the square metal pads.

9 Claims, 4 Drawing Sheets

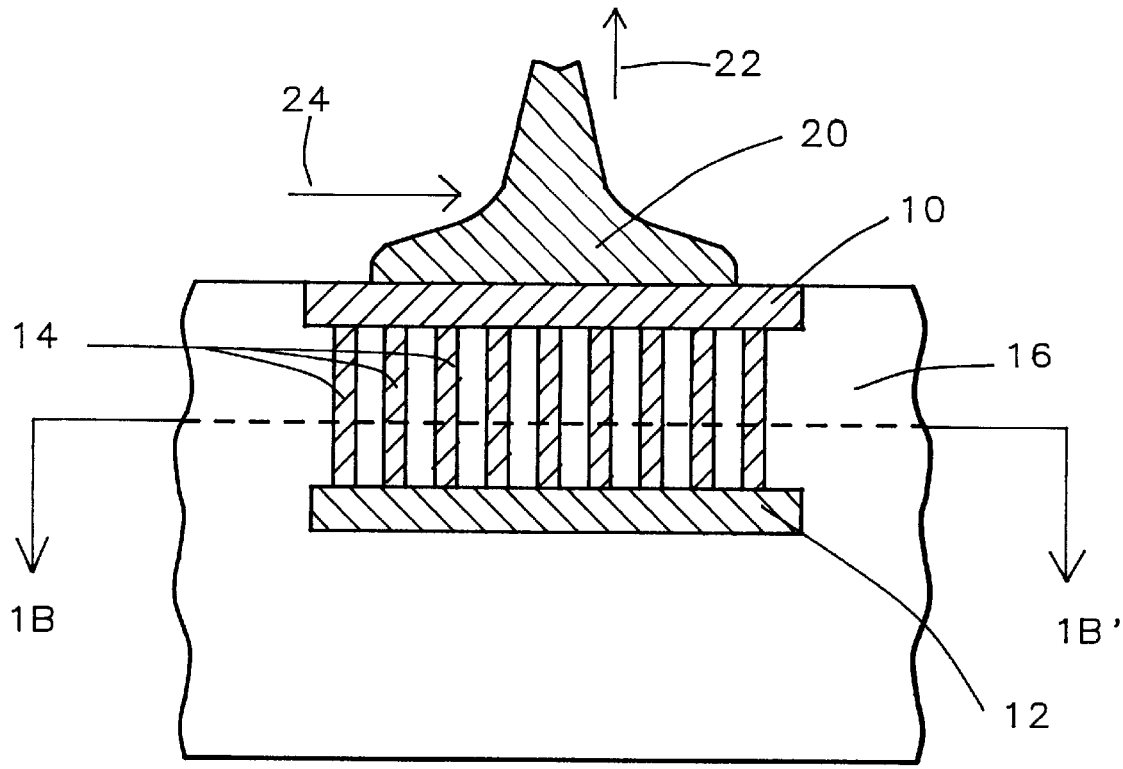
FIG. 1A - Prior Art
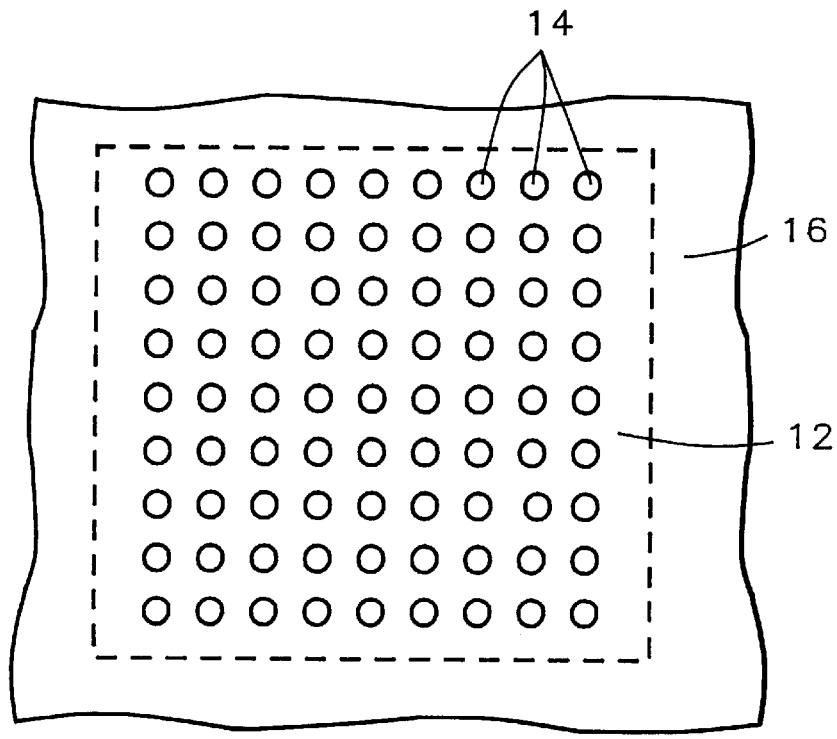
FIG. 1B - Prior Art

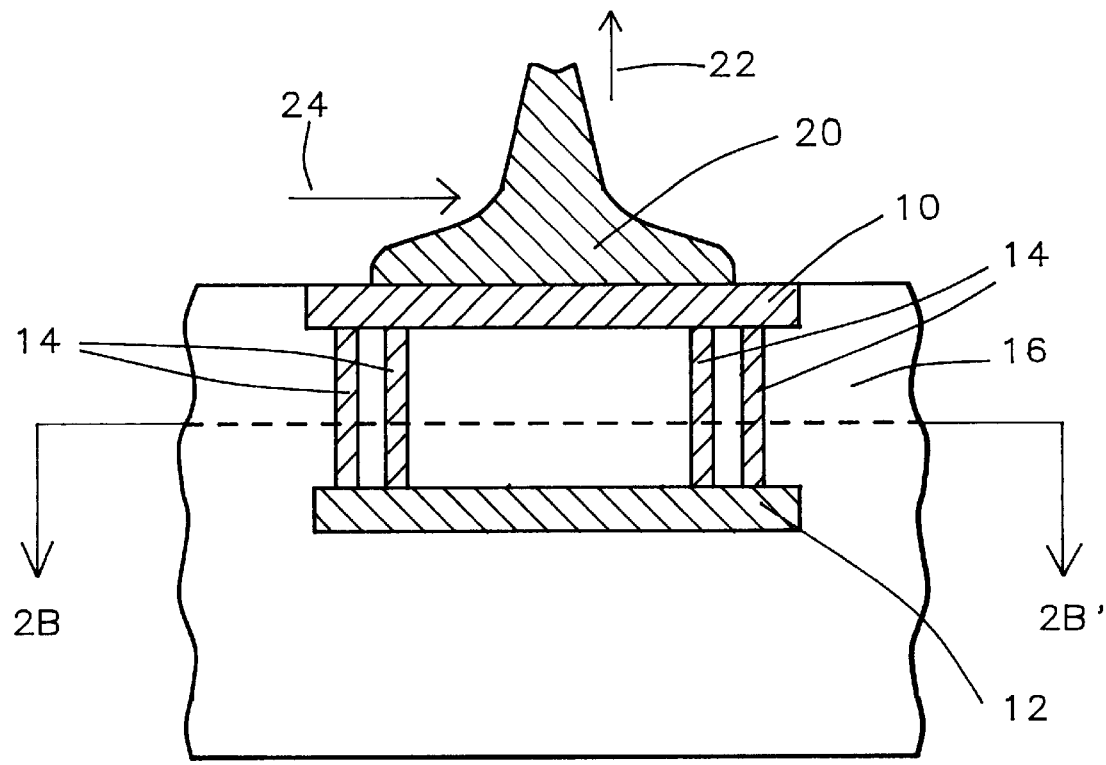
*FIG. 2A – Prior Art*
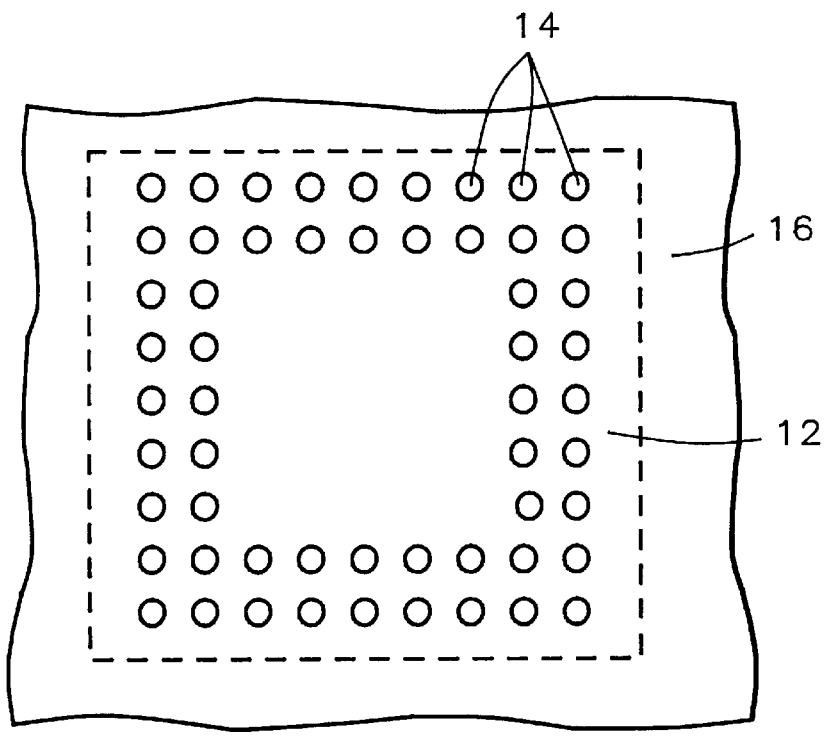
*FIG. 2B – Prior Art*

BOND PAD STRUCTURE FOR THE VIA PLUG PROCESS

This is a division of patent application Ser. No. 08/703,918, filing date Aug. 22, 1996, A Novel Bond Pad Structure and Method Of Forming The Structure For The Via Plug Process, assigned to the same assignee as the present invention, now U.S. Pat. No. 5,700,735.

BACKGROUND OF THE INVENTION (1) Field of the Invention

This invention relates to the structure of bond pads using the via plug process and more specifically to bond pads using three metal pad layers with via plugs between the first and second metal pad layers and between the second and third metal pad layers.

(2) Description of the Related Art

When an integrated circuit element has been completed electrical connections must be made to the next level of integration after the integrated circuit element. Bond pads provide a location for bonding wires or other connectors for this purpose. It is important that the bond pad structure be reliable and provide a reliable bond or the integrated circuit element will become useless.

A bond pad structure is shown in U.S. Pat. No. 5,266,522 to DiGiacomo et al. using metallurgy chosen to minimize corrosion and stress in the bond. U.S. Pat. No. 5,403,777 to Bryant et al. describes a bond pad using a barrier layer followed by two conducting layers to form a bond pad with good adhesion.

This invention provides a bond pad using three layers of metal pads with via plugs between the layers and is different than the bond pads described by DiGiacomo et al. or Bryant et al.

SUMMARY OF THE INVENTION

In circuit packages for integrated circuit elements and the like bond pads are often used to make electrical connections between the circuit package and the next level of integration. Interconnection wires are bonded to the bond pads and to the next level of integration.

Reliability of these bond pads is of critical importance and the wire to bond pad connection should withstand critical values of tensile and shear forces without failure. In order to test bond pads wires are bonded to a sample and subjected to tensile strength and shear strength testing. During such tensile strength and shear strength testing bond pad peeling and cracking must be minimized along with obtaining adequate tensile strength and shear strength values.

It is a principle objective of this invention to provide a bond pad structure which will provide adequate tensile strength and shear strength for a bond formed on the bond pad structure as well as reducing the frequency of bond pad peeling and cracking.

It is a further objective of this invention to provide a method of forming a bond pad structure which will provide adequate tensile strength and shear strength for a bond formed on the bond pad structure as well as reducing the frequency of bond pad peeling and cracking.

These objectives are achieved by forming a bond pad structure having two layers of via plugs formed between three metal layers. The via plugs are arranged in a diamond pattern and neither layer of via plugs is directly above the other. One of the three metal layers forms the bonding surface.

Examples of conventional bond pad structures are shown in FIGS. 1A–2B. FIG. 1A shows a cross section of the a bond pad showing a first metal pad 10 formed of a material such as AlCu/TiN and a second metal pad 12 formed of a material such as AlCu/TiN formed in a dielectric material 16 such as silicon dioxide formed using plasma enhanced deposition of tetraethyl orthosilicate. Via plugs 14 formed of a material such as tungsten are formed between the first metal pad 10 and the second metal pad 12. A test fixture 20 is shown bonded to the first metal pad 10. In testing the bond pad a tensile force 22 or a shear force 24 is applied to the test fixture 20.

FIG. 1B shows a plan view of the bond pad along the line 1B-1B' in FIG. 1A. The via plugs 14 are shown in a square array having the same orientation as the first metal pad 10 and the second metal pad 12. The second metal pad 12 is shown by a dashed line in FIG. 1B since the second metal pad is covered by the dielectric material 16. For the bond pad structure of FIGS. 1A and 1B the first metal pad and the second metal pad are each about 100 microns square and there are 81 via plugs each having a diameter of about 0.6 microns. These pads fail with a large amount of pad peeling.

FIGS. 2A and 2B show another example of a conventional bond pad structure. This bond pad structure is the same as the previous example except there are 56 via plugs 14 wherein these via plugs lie on two squares. FIG. 2A shows a cross section of the bond pad structure showing the via plugs 14 formed in a ceramic material 16 between a first metal pad 10 and a second metal pad 12. A test fixture 20 is shown bonded to the first metal pad 10. In testing the bond pad a tensile force 22 or a shear force 24 is applied to the test fixture 20.

FIG. 2B shows a plan view of the bond pad along the line 2B-2B' in FIG. 2A. The via plugs 14 are shown in a square array having the same orientation as the first metal pad 10 and the second metal pad 12. The second metal pad 12 is shown by a dashed line in FIG. 2B since the second metal pad is covered by the dielectric material 16. For the bond pad structure of FIGS. 2A and 2B the first metal pad and the second metal pad are each about 100 microns square and there are 56 via plugs each having a diameter of about 0.6 microns. These pads fail with a large amount of pad peeling.

BRIEF DESCRIPTION OF THE DRAWINGS

FIG. 1A shows a cross section view of a prior art bond pad.

FIG. 1B shows a plan view of a prior art bond pad along the line 1B-1B' of FIG. 1A.

FIG. 2A shows a cross section view of a prior art bond pad.

FIG. 2B shows a plan view of a prior art bond pad along the line 2B-2B' of FIG. 2A.

DESCRIPTION OF THE PREFERRED EMBODIMENTS

Figure 3:
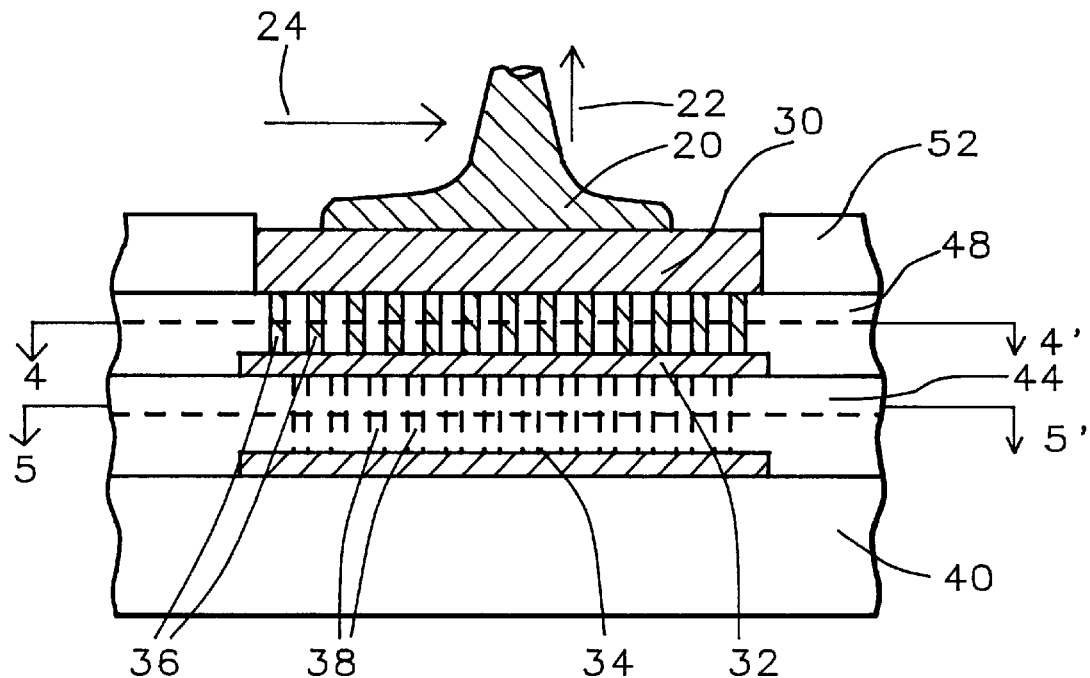
FIG. 3 shows a cross section view of the bond pad of this invention.
Figure 4:
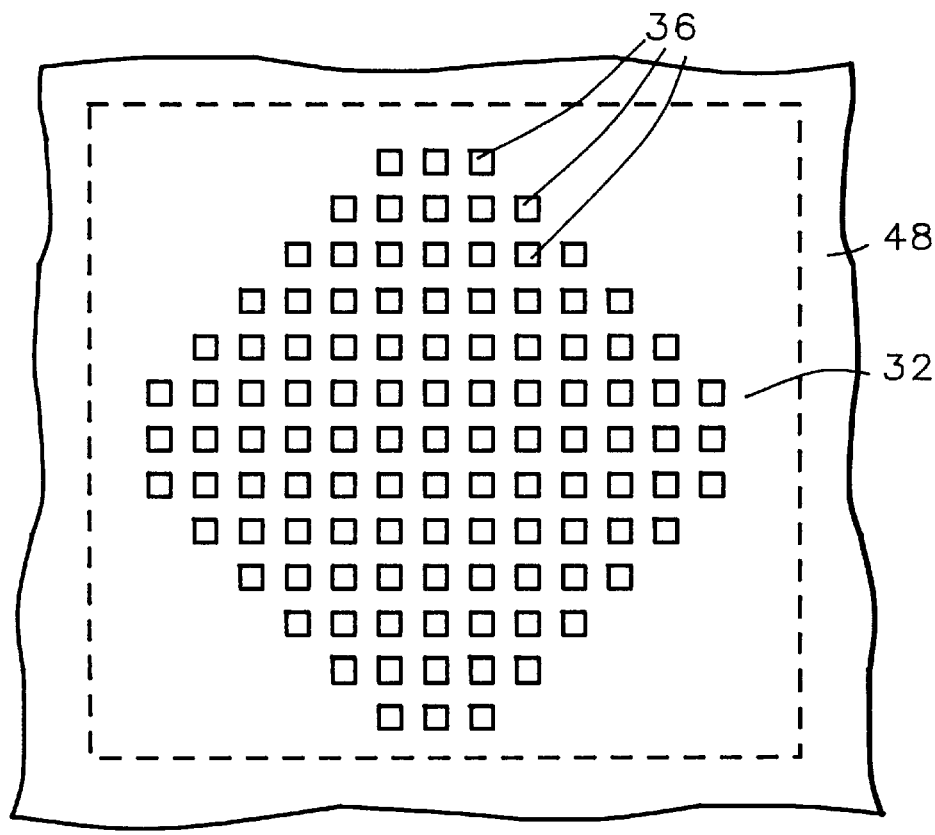
FIG. 4 shows a plan view of the bond pad of this invention along the line 4-4' of FIG. 3.
Figure 5:
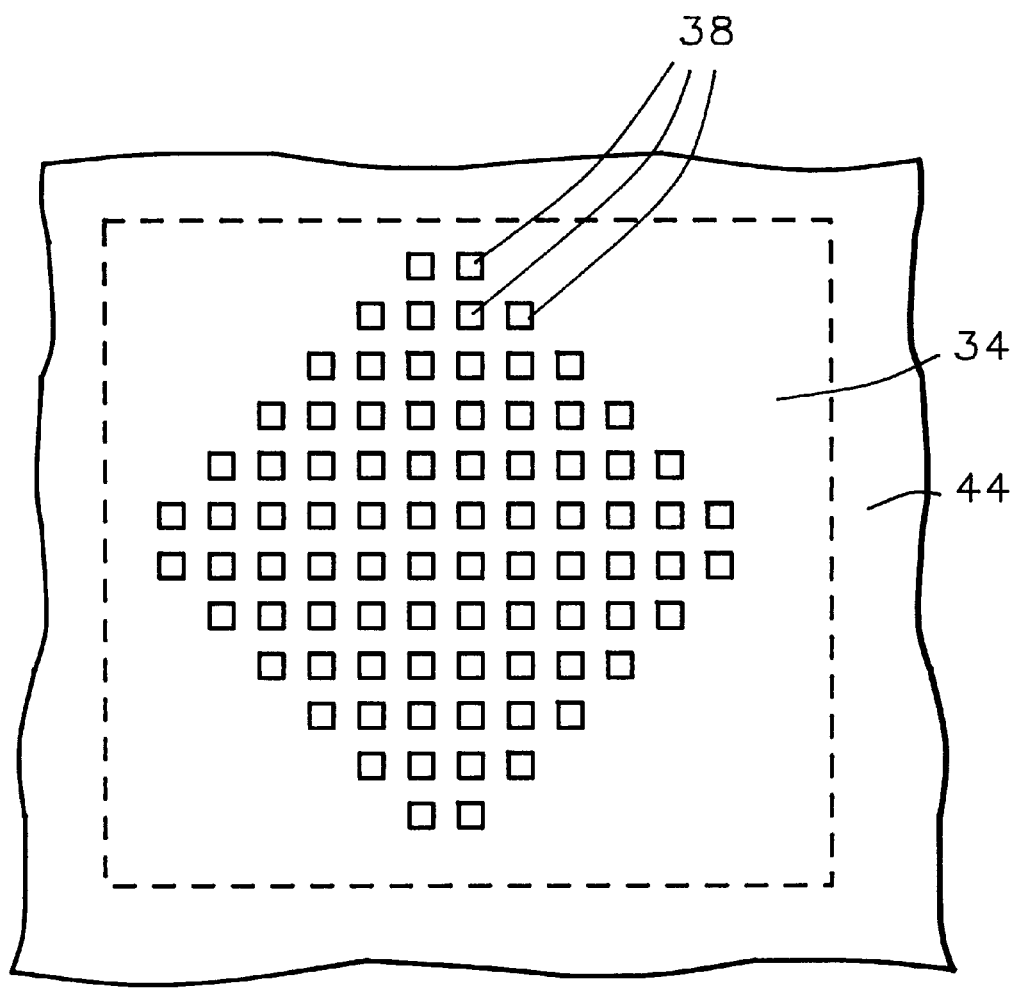
FIG. 5 shows a plan view of the bond pad of this invention along the line 5-5' of FIG. 3.

Refer now to FIGS. 3–5, there is shown an embodiment of the bond pad structure of this invention. FIG. 3 shows a cross section view of the bond pad structure of this embodiment. As shown in FIG. 3 a first metal pad 34, a second metal pad 32, and a third metal pad 30 are formed in a dielectric. A first number, between about 70 and 110, of first via plugs 38 are formed between the first metal pad 34 and the second metal pad 32. A second number, between about 85 and 135, of second via plugs 36 are formed between the second metal pad 32 and the third metal pad 30. The first number of first via plugs 38 are shown as dashed lines in FIG. 3 since the first via plugs are not in the same plane as the second via plugs 36 and are covered by dielectric material 44.

The third metal pad 30 is formed from a material such as AlCu/TiN, has a thickness of between about 6400 and 10,000 Angstroms, a length of between about 80 and 120 microns, and a width of between about 80 and 120 microns. The second metal pad 32 is formed from a material such as AlCu/TiN, has a thickness of between about 4000 and 7000 Angstroms, a length of between about 80 and 120 microns, and a width of between about 80 and 120 microns. The first metal pad 34 is formed from a material such as AlCu/TiN, has a thickness of between about 4000 and 7000 Angstroms, a length of between about 80 and 120 microns, and a width of between about 80 and 120 microns. The second via plugs 36 are formed of a material such as tungsten, have a square cross section of between about 0.4 and 0.8 microns by between about 0.4 and 0.8 microns, and have a length of between about 0.4 and 0.8 microns. The first via plugs 38 are formed of a material such as tungsten, have a square cross section of between about 0.4 and 0.8 microns by between about 0.4 and 0.8 microns, and have a length of between about 0.4 and 0.8 microns.

The first metal pad 34 is formed on a first dielectric layer 40. A second dielectric layer 44 is formed over the first metal pad 34 between the first metal pad 34 and the second metal pad 32 and has a thickness of between about 6000 and 10,000 Angstroms. The second metal pad 32 is formed on the second dielectric layer 44. The first via plugs 38 are formed in the second dielectric layer 44 and make contact with the first metal pad 34 and the second metal pad 32. A third dielectric layer 48 having a thickness of between about 6000 and 10,000 Angstroms is formed between the second metal pad 32 and the third metal pad 30. The third metal pad 30 is formed on the third dielectric layer 48. A fourth dielectric layer 52 having a thickness of between about 8000 and 12,000 Angstroms is formed on the third dielectric layer 48 after the formation of the third metal pad 30 so that the fourth dielectric layer surrounds and overlaps the edges of the third metal pad 30. The second via plugs 36 are formed in the third dielectric layer 48 and make contact with the second metal pad 32 and the third metal pad 30.

FIG. 3 shows a test fixture 20 bonded to the first metal pad 30. Either tensile forces 22 or shear forces 24 can be applied to the test fixture 20. The first, second, third, and fourth dielectric layers are formed of a material such as silicon dioxide formed using plasma enhanced deposition of tetraethyl orthosilicate.

FIG. 4 shows a plan view of the bond pad structure along the line 4-4' of FIG. 3. FIG. 4 shows the second via plugs 36 formed in the third dielectric layer 48. The second metal pad 32 is shown using a dashed line since it is covered by the third dielectric layer 48. The second via plugs 36 are square having a width of between about 0.6 and 0.8 microns. The second via plugs 36 are arranged in a diamond shape when compared to the second metal pad 32. The periphery of the first via plugs forms a square rotated 45° with respect to the second metal pad 32. The first metal pad, second metal pad, and third metal pad are squares having the same orientation.

FIG. 5 shows a plan view of the bond pad structure along the line 5-5' of FIG. 3. FIG. 5 shows the first via plugs 38 formed in the second dielectric layer 44. The first metal pad 34 is shown using a dashed line since it is covered by the second dielectric layer 44. The first via plugs 38 are square having a width of between about 0.6 and 0.8 microns. The first via plugs 38 are arranged as a diamond shape when compared to the first metal pad 34. The periphery of the first via plugs forms a square rotated 45° with respect to the first metal pad 34. The first metal pad, second metal pad, and third metal pad are squares having the same orientation. The second via plugs 36 are not located directly above the first via plugs 38, see FIG. 3, but are located directly over the spaces between the first via plugs 38.

This arrangement of three metal pads, first via plug array, and second via plug array provides improved strength and reliability for the bond pad. As shown in FIG. 3, a test fixture 20 can be bonded to the third metal pad 30. Either tensile forces 22 or shear forces 24 can be applied to the test fixture 20. For the bond pad described in this embodiment 0.01% of the bond pads fail with tensile forces up to 5 grams and 0.1% of the bond pads fail with shear forces up to 35 grams. Almost none of these failures are due to bond pad peeling.

Refer now to FIG. 3, there is shown an embodiment of a method of forming the bond pad structure of this invention. A first dielectric layer 40 having a thickness of between about 8000 and 12,000 Angstroms is formed of a material such as boron/phosphorus doped silicon dioxide using deposition of tetraethyl orthosilicate. A first metal pad 34, formed of a material such as AlCu/TiN having a length of between about 80 and 120 microns, a width of between about 80 and 120 microns, and a thickness of between about 4000 and 7000 Angstroms, is formed on the first dielectric layer 40. A second dielectric layer 44 having a thickness of between about 8000 and 10,000 Angstroms is formed of a material such as silicon dioxide using plasma enhanced deposition of tetraethyl orthosilicate on the first dielectric layer 40 covering the first metal pad 34. Openings for the first via plugs 38, having a square cross section of between about 0.4 and 0.8 microns by between about 0.4 and 0.8 microns, are formed in the second dielectric layer 44 and filled with a metal such as tungsten thereby forming the first via plugs 38.

A second metal pad 32, formed of a material such as AlCu/TiN having a length of between about 80 and 120 microns, a width of between about 80 and 120 microns, and a thickness of between about 4000 and 7000 Angstroms, is formed on the second dielectric layer 44 forming contact with the first via plugs 38. A third dielectric layer 48 having a thickness of between about 6000 and 10,000 Angstroms is formed of a material such as silicon dioxide using plasma enhanced deposition of tetraethyl orthosilicate on the second dielectric layer 44 covering the second metal pad 32. Openings for the second via plugs 36, having a square cross section of between about 0.4 and 0.8 microns by between about 0.4 and 0.8 microns, are formed in the third dielectric layer 48 and filled with a metal such as tungsten thereby forming the second via plugs 36.

A third metal pad 30, formed of a material such as AlCu/TiN having a length of between about 80 and 120 microns, a width of between about 80 and 120 microns, and a thickness of between about 7000 and 10,000 Angstroms, is formed on the third dielectric layer 48 forming contact with the second via plugs 36. A fourth dielectric layer 52 having a thickness of between about 8000 and 12,000 Angstroms is formed of a material such as silicon dioxide using plasma enhanced deposition of tetraethyl orthosilicate on the third dielectric layer 48 covering the third metal pad 30. Most of that part of the fourth dielectric layer directly over the third metal pad 30 is then etched away leaving some of the fourth dielectric layer 52 overlapping the edges of the third metal pad 30.

While the invention has been particularly shown and described with reference to the preferred embodiments thereof, it will be understood by those skilled in the art that various changes in form and details may be made without departing from the spirit and scope of the invention.

What is claimed is:

1. A bond pad structure, comprising:

a first dielectric layer;

a square first metal pad formed on said first dielectric layer;

a second dielectric layer formed over said first metal pad;

a square second metal pad formed over said second dielectric layer wherein said second metal pad is directly above said first metal pad and has the same orientation as said first metal pad;

a third dielectric layer formed over said second metal pad;

a square third metal pad formed over said third dielectric layer wherein said third metal pad is directly above said second metal pad and has the same orientation as said second metal pad;

a fourth dielectric layer, having an opening, formed over said third metal pad wherein said opening in said fourth dielectric layer is formed directly over said third metal pad and exposes part of said third metal pad;

a first number of first via plugs formed between said first metal pad and said second metal pad wherein said first via plugs comprise holes in said second dielectric layer filled with a fourth metal, said first via plugs contact said first metal pad and said second metal pad, and said first number of said first via plugs lie within a first square rotated 45° with respect to said first metal pad; and a second number of second via plugs formed between said second metal pad and said third metal pad wherein said second via plugs comprise holes in said third dielectric layer filled with a fifth metal, said second vias contact said second metal pad and said third metal pad, said second number of said second via plugs lie within a second square rotated 45° with respect to said third metal pad, and none of said second via plugs are directly above any of said first via plugs.

2. The bond pad structure of claim 1 wherein said first metal pad is AlCu/TiN.

3. The bond pad structure of claim 1 wherein said second metal pad is AlCu/TiN.

4. The bond pad structure of claim 1 wherein said third metal pad is AlCu/TiN.

5. The bond pad structure of claim 1 wherein said fourth metal is tungsten.

6. The bond pad structure of claim 1 wherein said fifth metal is tungsten.

7. The bond pad structure of claim 1 where said first number of first via plugs is between about 70 and 110.

8. The bond pad structure of claim 1 wherein said second number of second via plugs is between about 85 and 135.

9. The bond pad structure of claim 1 wherein said second dielectric layer, said third dielectric layer, and said fourth dielectric are silicon dioxide.

* * * * *